United States Patent
Hayakawa et al.

(10) Patent No.: US 6,862,436 B2
(45) Date of Patent: Mar. 1, 2005

(54) HIGH FREQUENCY CIRCUIT BOARD AND ANTENNA SWITCH MODULE FOR HIGH FREQUENCY USING THE SAME

(75) Inventors: Toshitaka Hayakawa, Nagoya (JP); Daisuke Kato, Komaki (JP)

(73) Assignee: NGK Spark Plug Co., Ltd., Aichi (JP)

( * ) Notice: Subject to any disclaimer, the term of this patent is extended or adjusted under 35 U.S.C. 154(b) by 298 days.

(21) Appl. No.: 10/085,412

(22) Filed: Feb. 27, 2002

(65) Prior Publication Data

US 2002/0123313 A1 Sep. 5, 2002

(30) Foreign Application Priority Data

Feb. 27, 2001 (JP) ..................................... P.2001-052571

(51) Int. Cl.[7] .............................................. H04B 1/04
(52) U.S. Cl. ...................... 455/121; 455/82; 455/193.1; 341/785
(58) Field of Search ................................ 455/121, 125, 455/136, 137, 138, 140, 193.1, 269, 273, 245, 276.1, 67.11, 82; 343/700, 702, 741, 785, 777, 876, 911 R

(56) References Cited

U.S. PATENT DOCUMENTS 5,473,293 A 12/1995 Yoshikazu et al.

FOREIGN PATENT DOCUMENTS

| EP | 0704925 A1 | 4/1996 |
| EP | 0 784 384 A1 | 7/1997 |
| EP | 021642 A2 | 6/1999 |
| JP | 6-204912 | 7/1994 |
| JP | 7-202503 | 8/1995 |

OTHER PUBLICATIONS

European Search Report dated Aug. 22, 2003.

*Primary Examiner*—Tony T. Nguyen
(74) *Attorney, Agent, or Firm*—Sughrue Mion, PLLC

(57) ABSTRACT

A high frequency circuit board comprising: a choke coil circuit element of a high frequency switching circuit; a dielectric laminated structure body comprising a plurality of dielectric layers which comprise a first dielectric layer and a second dielectric layer; a land formed on the first dielectric layer; and a circuit pattern formed on the second dielectric layer, wherein the choke coil circuit element is mounted on the land as a chip inductor, the first dielectric layer is located at the end of the body, the second dielectric layer is located nearest to the first board in at least one of the dielectric layers on which a circuit pattern is formed, and the land is positioned out of a region formed by projecting the circuit pattern formed on the second dielectric layer in the direction of laminating of the plurality of dielectric layers.

7 Claims, 5 Drawing Sheets

HIGH FREQUENCY CIRCUIT BOARD AND ANTENNA SWITCH MODULE FOR HIGH FREQUENCY USING THE SAME

FIELD OF THE INVENTION

The present invention relates to a high frequency circuit board which can be used for a communication device such as a portable telephone and an antenna switch module for high frequency using it, and to an antenna switch module for high frequency.

BACKGROUND OF THE INVENTION

In a communication device such as a portable telephone, a high frequency switch module has been hitherto used to connect a receiving circuit to an antenna and to connect a transmitting circuit to an antenna. In such a high frequency switch module, for the purpose of obtaining the compact and light-weight communication device itself, a plurality of circuit elements are partly formed on dielectric substrates to have a dielectric laminated structure body (harmonic circuit board) and remaining circuit elements are formed as chip elements which are mounted on the outer surface of the dielectric laminated structure body to constitute a unit with a complex structure (Refer to JP-A-6-204912 (The term "JP-A" as used herein means an "unexamined published Japanese patent application")).

For instance, as disclosed in JP-A-8-97743, in the well-known high frequency switch of this type, an anode of a first diode is connected to a transmitting circuit through a capacitor and the anode of the first diode is grounded through a series circuit having a first stripline serving as a choke coil and a capacitor. A first control terminal is connected to an intermediate point of the first stripline and the capacitor. To the first control terminal, a control circuit for switching the high frequency switch is connected. Further, a cathode of the first diode is connected to an antenna through another capacitor. A receiving circuit is connected to the antenna through the another capacitor and a series circuit including a second stripline and a capacitor. To an intermediate point of the second stripline and the capacitor, an anode of a second diode is connected. A cathode of the second diode is grounded through the capacitor. A second control terminal is connected to an intermediate point of the second stripline and the capacitor. To the second control terminal, a control circuit for switching the high frequency switch is connected.

The high frequency switch constructed as described above is adapted to control bias voltage applied to the first and second control terminals to switch a transmitting signal and a receiving signal.

Further, in JP-A-8-97743, there is proposed a structure that the high frequency switching circuit elements and filter circuit elements of the above-described construction are formed on a plurality of dielectric substrates except the diodes which form a high frequency device among the high frequency switching circuit elements, the diodes are formed as chip elements and the diode chip elements are mounted on the lamination body composed of the plural dielectric substrates.

SUMMARY OF THE INVENTION

The well-known antenna switch module unit for high frequency in which the diodes of the high frequency switching circuit elements forming the high frequency device are formed as the chip elements, the remaining elements of the high frequency switching circuit elements and the filter circuit elements are formed on the plural dielectric substrates to have the lamination body and the diode chip elements are mounted on the lamination body as mentioned above does not sufficiently satisfy a demand for small size depending on a compact and light-weight communication device itself. More specifically, in the above described well-known structure, the stripline serving as the choke coil connected to the anode of the diode connected between the antenna and the transmitting circuit is designed to have length not longer than $\lambda/4$ as long as the line, assuming that the wavelength of the transmitting signal from the transmitting circuit is $\lambda$, in order to prevent the leakage of a high frequency signal to the driving circuit of the high frequency device in a high frequency switching circuit. Therefore, the stripline actually needs to have considerably large inductance (for instance, about 100 nH). Accordingly, it is necessary to use substrates respectively having relatively large areas in order to form the patterns of the striplines on the dielectric substrates. This fact makes it necessary to set the length and width dimensions of the lamination body composed of the dielectric substrates so as to meet the areas required for patterning the striplines. Therefore, there has been a limitation for achieving an antenna switch module with compact size.

On the other hand, a communication device such as a portable telephone has a tendency to become compact and light more and more. Accordingly, an accommodation capacity for a high frequency switch in the device is also decreased. Thus, it has been demanded to realize a high frequency switch module with such a dimension as to meet the decreased accommodation capacity.

Therefore, it is an object of the present invention to solve the problems encountered in the existing high frequency switch module and to provide a high frequency circuit board which can be adapted to the decrease of an accommodation capacity defined in a communication device and can reduce an influence such as an interference by inductor elements and a compact antenna switch module for high frequency using the above high frequency circuit board.

For achieving the above-described object, according to a first invention of the present invention, a high frequency circuit board comprising: a choke coil circuit element of a high frequency switching circuit; a dielectric laminated structure body comprising a plurality of dielectric layers which comprise a first dielectric layer and a second dielectric layer; a land formed on the first dielectric layer; and a circuit pattern formed on the second dielectric layer, wherein the choke coil circuit element is mounted on the land as a chip inductor, the first dielectric layer is located at the end of the body, the second dielectric layer is located nearest to the first board in at least one of the dielectric layers on which a circuit pattern is formed, and the land is positioned out of a region formed by projecting the circuit pattern formed on the second dielectric layer in the direction of laminating of the plurality of dielectric layers.

According to a second invention of the present invention, the high frequency circuit board described in the first invention, wherein the circuit pattern is an inductor circuit.

According to a third invention of the present invention, an antenna switch module for high frequency comprising: a filter circuit comprising an element; a high frequency switching circuit comprising a choke coil circuit element; a dielectric laminated structure body comprising a plurality of dielectric layers which comprise a first dielectric layer and a second dielectric layer; a land formed on the first dielectric layer; and a circuit pattern formed on the second dielectric layer, wherein the choke coil circuit element is mounted on the land as a chip inductor, the element is in the body, the first dielectric layer is located at the end of the body, the second dielectric layer is located nearest to the first dielectric layer in at least one of the dielectric layers on which a circuit pattern is formed, and the land is positioned out of a region formed by projecting the circuit pattern formed on the second dielectric layer in the direction of laminating of the plurality of dielectric layers.

According to a fourth invention of the present invention, the antenna switch module for high frequency as described in the third invention, wherein the high frequency switching circuit comprises a diode forming a high frequency device, a resistance, a capacitor and an inductor, the diode, the resistance and a part of the capacitor are formed as a chip element and the inductor and the remaining parts of the capacitor are formed in the dielectric laminated structure body.

According to a fifth invention of the present invention, the antenna switch module for high frequency as described in the third invention, wherein the filter circuit comprises a plurality of capacitor elements and a plurality of inductor elements, and the plurality of dielectric layers comprises: a plurality of dielectric layers on which the plurality of capacitor elements are formed; a plurality of dielectric layers on which the plurality of inductor elements are formed; and a plurality of dielectric layers on which other elements than the elements formed as chip elements in the high frequency switching circuit are formed.

According to a sixth invention of the present invention, the antenna switch module for high frequency as described in the fourth invention, wherein the filter circuit comprises a plurality of capacitor elements and a plurality of inductor elements, and the plurality of dielectric layers comprises: a plurality of dielectric layers on which the plurality of capacitor elements are formed; a plurality of dielectric layers on which the plurality of inductor elements are formed; and a plurality of dielectric layers on which other elements than the elements formed as chip elements in the high frequency switching circuit are formed.

According to a seventh invention of the present invention, an antenna switch module for high frequency comprising: two filter circuits each comprising an element; two high frequency switching circuit each comprising a choke coil circuit element; two diplexer circuits each comprising an element; a dielectric laminated structure body comprising a plurality of dielectric layers which comprise a first dielectric layer and a second dielectric layer; lands formed on the first dielectric layer; and a circuit pattern formed on the second dielectric layer, wherein each of the high frequency switching circuits is connected to an antenna through the diplexer circuit, the choke coil circuit element is mounted on the land as a chip inductor, all of the element are in the body, the first dielectric layer is located at the end of the body, the second dielectric layer is located nearest to the first dielectric layer in at least one of the dielectric layers on which a circuit pattern is formed, and the land is positioned out of a region formed by projecting the circuit pattern formed on the second dielectric layer in the direction of laminating of the plurality of dielectric layers.

DESCRIPTION OF REFERENCE NUMERALS AND SIGNS

ANT: antenna terminal
SW: high frequency switching circuit
SW1: high frequency switching circuit
SW2: high frequency switching circuit
L1: inductor (choke circuit element)
LPF: low-pass filter
LPF1: low-pass filter
LPF2: low-pass filter
DP: diplexer
16 to 33. land

DETAILED DESCRIPTION OF THE INVENTION

Now, referring to the accompanying drawings, embodiments of the present invention will be described below.

The term "circuit pattern" as used herein means a "conductive layer which is formed in a dielectric laminated structure body and contains a capacitor, an inductor, an electrodes of a resistance, or the like and a transmission line".

The term "filter circuit" as used herein means a "circuit pattern which contains at least one of a capacitor and an inductor, such as a low-pass filter, a high-pass filter, a band-pass filter, a band elimination filter, and the like".

The term "inductor circuit" as used herein means a "circuit pattern which is formed in a dielectric laminated structure body and contains an inductor constituent, such as an inductor, a stripline and the like".

Figure 1:
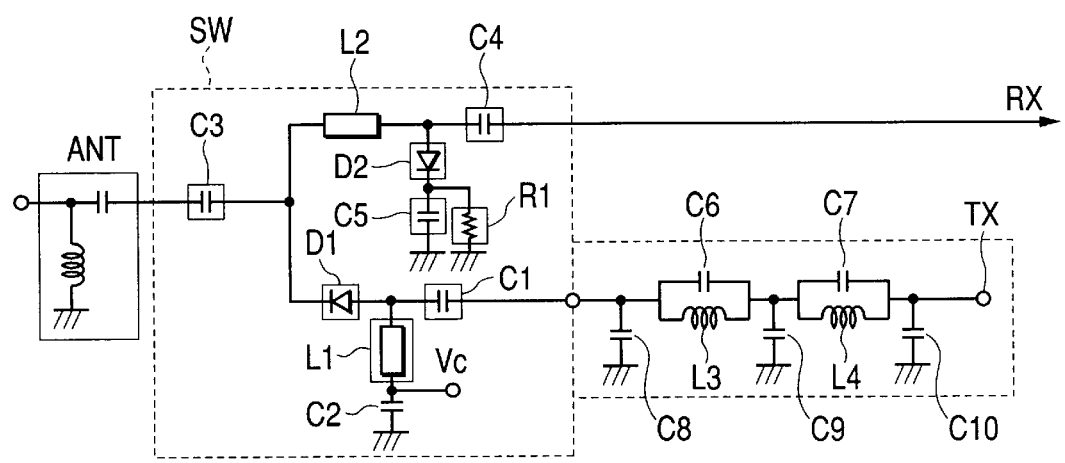
FIG. 1 is a circuit diagram showing one example of a circuit structure of an antenna switch module for high frequency according to one embodiment of the present invention.

FIG. 1 shows one example of a circuit structure of an antenna switch module for high frequency according to one embodiment of the present invention. SW designates a high frequency switching circuit comprising two diodes D1 and D2, two inductors L1 and L2, five capacitors C1, C2, C3, C4 and C5 and one resistance R1. That is, the anode of the first diode D1 is connected to a transmitting circuit TX via a low-pass filter LPF through the first capacitor C1. A node of the first diode D1 and the first capacitor C1 is grounded through a series circuit including the first inductor L1 serving as a choke coil and the second capacitor C2. A control terminal VC is connected to a part between the first inductor L1 and the second capacitor C2. Further, the cathode of the first diode D1 is connected to an antenna terminal ANT through the third capacitor C3 at one side and to one end of the second inductor L2 at the other side. The other end of the second inductor L2 is connected to a receiving circuit RX through the fourth capacitor C4. A node between the second inductor L2 and the fourth capacitor C4 is grounded through a series circuit including the second diode D2 and the fifth capacitor C5. The resistance R1 is connected in parallel with the fifth capacitor C5.

The low-pass filter LPF provided or connected between the high frequency switching circuit SW and the transmitting circuit TX comprises inductors L3 and L4 and capacitors C6 to C10. These elements are connected in such a manner as shown in FIG. 1.

In the operation of the antenna switch module for high frequency constructed as described above, when positive voltage is applied to the control terminal VC, bias is applied to the first diode D1 and the second diode D2 in a forward direction to make these diodes electrically conductive. Thus, a transmitting signal from the transmitting circuit TX is transmitted to the antenna ANT through the low-pass filter LPF, the capacitor C1, the first diode D1 and the capacitor C3. In this case, in a circuit leading to the receiving circuit side, since the second diode D2 is brought to an electrically conductive state, the second inductor L2 is grounded. Accordingly, the transmitting signal from the transmitting circuit TX is not transmitted to the receiving circuit RX side. In such a way, a transmitting state is established.

On the other hand, when negative voltage is applied to the control terminal VC, bias is applied to the first diode D1 and the second diode D2 in a backward direction so that these diodes are made electrically non-conductive. Thus, a receiving signal from the antenna ANT is transmitted to the receiving circuit RX. In such a way, a receiving state is established.

Figure 2:
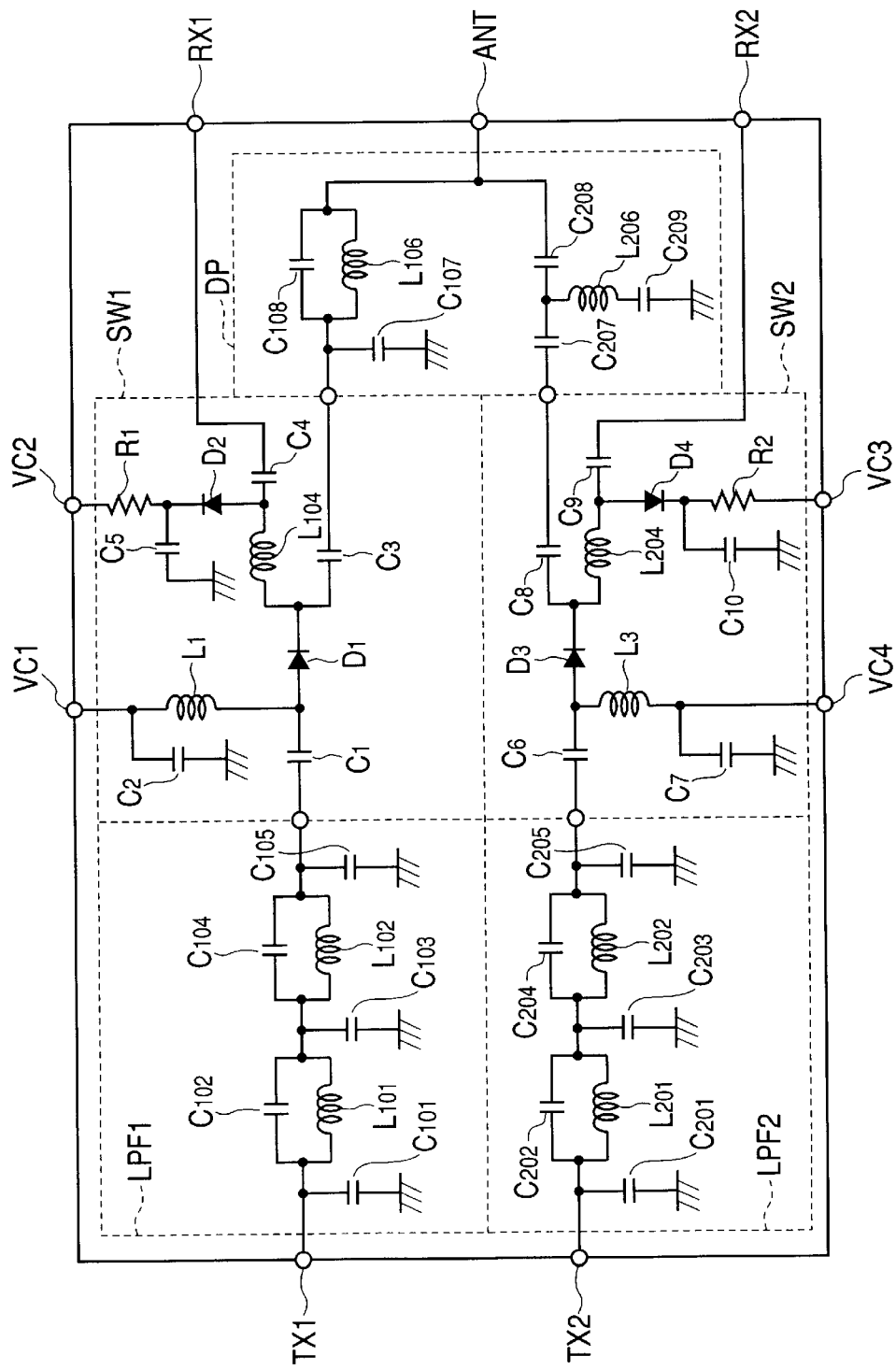
FIG. 2 is a circuit diagram showing one example of a circuit structure of an antenna switch module for high frequency constructed for a dual band according to another embodiment of the present invention.

FIG. 2 schematically shows the circuit structure of an antenna switch module for high frequency used for a dual band according to another embodiment of the present invention. An illustrated antenna switch comprises filters LPF1 and LPF2, switch circuits SW1 and SW2 and a diplexer DP and the like. The antenna switch includes a transmitting terminal TX1 connected to a transmitting part for GSM, a transmitting terminal TX2 connected to a transmitting part for DSC, a receiving terminal RX1 connected to a receiving part for GSM, a receiving terminal RX2 connected to a receiving part for DSC, an antenna terminal ANT connected to an antenna, control terminals VC1, VC2, VC3 and VC4 connected to a control part and an earth terminal GND connected to the reference potential of a wireless part.

The filter LPF 1 comprises circuit elements including capacitors C101, C102, C103, C104 and C105 and inductors L101 and L102. These circuit elements are connected in such a manner as shown in FIG. 2 and form a low-pass filter.

The filter LPF2 comprises circuit elements of capacitors C201, C202, C203, C204 and C205 and inductors L201 and L202. These circuit elements are connected in a similar manner to that of the above-described filter LPF1 to form a low-pass filter. The filter LPF 2 is equal to the above-described filter LPF1 except that the cut-off frequency of the filter LPF2 is different from that of the filter LPF1.

The switch circuit SW1 has a function for switching a signal path for outputting a transmitting signal (GSM) passing the filter LPF1 to the antenna terminal ANT or a signal path for inputting a receiving signal (GSM) received from an antenna to the receiving part for the GSM. The illustrated switch circuit SW1 is located in the next stage of the filter LPF1 and comprises circuit elements including coupling capacitors C1, C3 and C4, bypass capacitors C2 and C5, a choke coil L1, an inductor L104, a resistance R1 and high frequency switching diodes D1 and D2.

The switch circuit SW2 has a function for switching a signal path for outputting a transmitting signal (DCS) passing the filter LPF2 to the antenna terminal ANT or a signal path for inputting a receiving signal (DCS) received from the antenna to the receiving part for the DCS. The switch circuit SW2 has a construction substantially equal to that of the above-described switch circuit SW1. The illustrated switch circuit SW2 is located in the next stage of the filter LPF2, and comprises circuit elements including coupling capacitors C6, C8 and C9, bypass capacitors C7 and C10, a choke coil L3, an inductor L204, a resistance R2 and high frequency switching diodes D3 and D4.

The diplexer DP is composed of the combination of a low-pass filter (LPF) and a high-pass filter (HPF). In the illustrated example, the diplexer DP comprises a low-pass filter connected between the coupling capacitor C3 of the switch circuit SW1 and the antenna terminal ANT and including circuit elements of capacitors C107 and C108 and an inductor L106 and a high-pass filter connected between the coupling capacitor C8 of the switch circuit SW2 and the antenna terminal ANT and including circuit elements of capacitors C207, C208 and C209 and an inductor L206.

Figure 3:
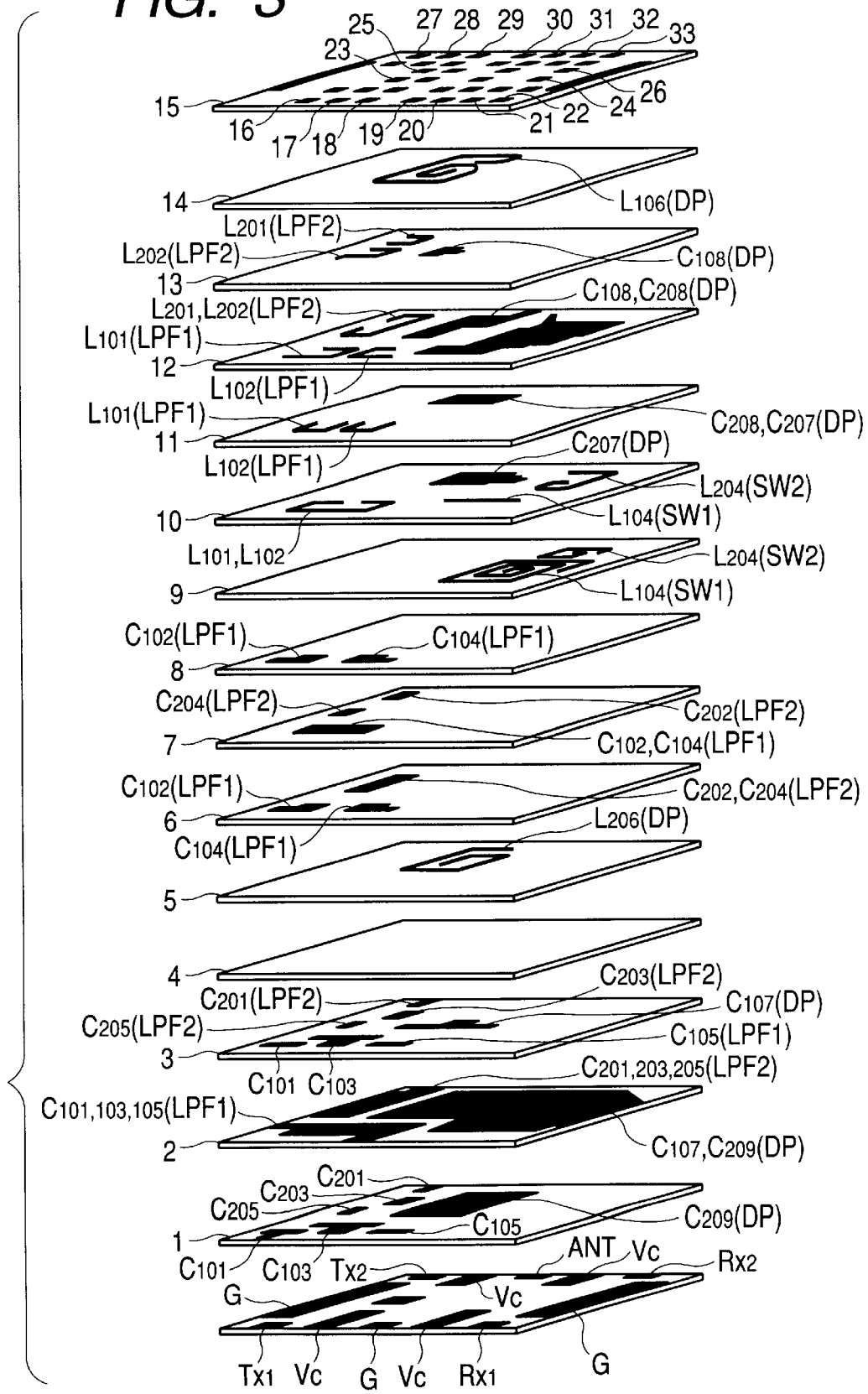
FIG. 3 is an exploded perspective view showing the construction of a dielectric laminated structure body in the antenna switch module for high frequency shown in FIG. 2.

FIG. 3 is a schematic exploded view of a dielectric laminated structure body of the antenna switch module having the above-described circuit structure and constructed for the dual band.

As shown in the figure, the dielectric laminated structure body of the antenna switch module comprises dielectric substrates having 15 layers 1, 2, 3, 4, 5, 6, 7, 8, 9, 10, 11, 12, 13, 14 and 15. The circuit elements except the circuit elements including the coupling capacitors C1, C3 and C4, the capacitor C2, the bypass capacitor C5, the choke coil L1, the resistance R1 and the high frequency switching diodes D1 and D2 in the switch circuit SW1 and the circuit elements except the circuit elements including the coupling capacitors C6, C8 and C9, the capacitor C7, the bypass capacitor C10, the choke coil L3, the resistance R2 and the high frequency switching diodes D3 and D4 in the switch circuit SW2 among the circuit elements shown in FIG. 2 are respectively formed on one or a plurality of substrates corresponding thereto in the dielectric substrates which respectively form high frequency circuit boards.

More specifically, referring to FIG. 3, on the first dielectric substrate 1 are formed the electrodes of the capacitors C101, C103 and C105 forming the low-pass filter LPF1, the electrodes of the capacitors C201, C203 and C205 forming the low-pass filter LPF2 and the electrode of the capacitor C209 forming the diplexer DP.

On the second dielectric substrate 2, are formed the electrodes of the capacitors C101, C103 and C105 forming the low-pass filter LPF1, the electrodes of the capacitors C201, C203 and C205 forming the low-pass filter LPF2, the electrode of the capacitor C209 forming the diplexer DP and the electrode of the capacitor C107 forming the diplexer DP.

On the third dielectric substrate 3, are formed the electrodes of the capacitors C101, C103 and C105 as elements of the low-pass filter LPF1, the electrodes of the capacitors C201, C203 and C205 as elements of the low-pass filter LPF2 and the electrode of the capacitor C107 as an element of the diplexer DP.

On the fifth dielectric substrate 5, is formed the inductor L206 as an element of the diplexer DP.

In the sixth dielectric substrate 6, are formed the electrodes of the capacitors C102 and C104 as elements of the low-pass filter LPF1 and the electrodes of the capacitors C202 and C204 as elements of the low-pass filter LPF2.

On the seventh dielectric substrate 7, are formed the electrodes of the capacitors C102 and C104 included in the low-pass filter LPF1 and the electrodes of the capacitors C202 and C204 included in the low-pass filter LPF2.

On the eighth dielectric substrate 8, are formed the electrodes of the capacitors C102 and C104 included in the low-pass filter LPF1.

On the ninth dielectric substrate 9, are formed the inductor L104 included in the switch circuit SW1 and the inductor L204 included in the switch circuit SW2.

On the tenth dielectric substrate 10, are formed the inductor L104 forming the switch circuit SW1, the inductor L204 forming the switch circuit SW2, the inductors L101 and L102 forming the low-pass filter LPF1 and the electrode of the capacitor C207 forming the diplexer DP.

On the eleventh dielectric substrate 11, are formed the inductors L101 and L102 forming the low-pass filter LPF1 and the electrodes of the capacitors C207 and C208 forming the diplexer DP.

On the twelfth dielectric substrate 12, are formed the inductors L101 and L102 forming the low-pass filter LPF1, the inductors L201 and L202 forming the low-pass filter LPF2 and the electrodes of the capacitors C108 and C208 forming the diplexer DP.

On the thirteenth dielectric substrate 13, are formed the inductors L201 and L202 forming the low-pass filter LPF2 and the electrode of the capacitor C108 forming the diplexer DP.

On the fourteenth dielectric substrate 14, is formed the inductor L106 forming the diplexer DP.

On the surface of the high frequency circuit board, in other words, on the dielectric substrate 15 forming the uppermost layer of the dielectric laminated structure body, are formed lands on which nine circuit elements including the coupling capacitors C1, C3 and C4, the capacitor C2, the bypass capacitor C5, the choke coil L1, the resistance R1 and the high frequency switching diodes D1 and D2 in the switch circuit SW1, and nine circuit elements including the coupling capacitors C6, C8 and C9, the capacitor C7, the bypass capacitor C10, the choke coil L3, the resistance R2 and the high frequency switching diodes D3 and D4 in the switch circuit SW2 among the circuit elements shown in FIG. 2 are mounted as chip elements.

Figure 4:
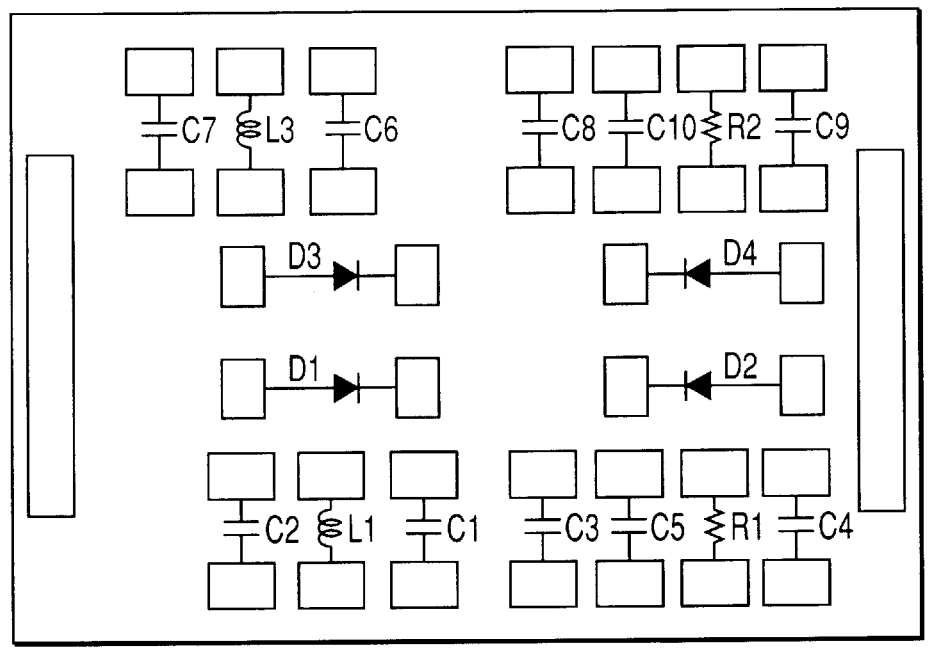
FIG. 4 is a schematic plan view showing lands for mounting chip elements forming circuit elements in switch circuits SW1 and SW2 formed on the surface of a high frequency circuit board in an uppermost layer of the dielectric laminated structure body shown in FIG. 3.

More specifically, as shown in FIG. 4, there are formed a land 16 on which the capacitor C2 is mounted, a land 17 on which the choke coil L1 is mounted, a land 18 on which the capacitor C1 is mounted, a land 19 on which the capacitor C3 is mounted, a land 20 on which the capacitor C5 is mounted, a land 21 on which the resistance R1 is mounted, a land 22 on which the capacitor C4 is mounted, a land 23 on which the high frequency switching diode D1 is mounted, a land 24 on which the high frequency switching diode D2 is mounted, a land 25 on which the high frequency switching diode D3 is mounted, a land 26 on which the high frequency switching diode D4 is mounted, a land 27 on which the capacitor C7 is mounted, a land 28 on which the choke coil L3 is mounted, a land 29 on which the capacitor C6 is mounted, a land 30 on which the capacitor C8 is mounted, a land 31 on which the capacitor C10 is mounted, a land 32 on which the resistance R2 is mounted and a land 33 on which the capacitor C9 is mounted. These elements which are not especially shown are connected in such a manner as to have the circuit structure as shown in FIG. 2.

Further, referring to FIG. 3, in the lower side of the first dielectric substrate 1, a substrate is illustrated on which are respectively formed the patterns of the transmitting terminal TX1 connected to the transmitting part for the GSM, the transmitting terminal TX2 connected to the transmitting part for the DCS, the receiving terminal RX1 connected to the receiving part for the GSM, the receiving terminal RX2 connected to the receiving part for the DCS, the antenna terminal ANT connected to the antenna, the control terminal VC connected to the control part and the earth terminal G connected to the reference potential of the wireless part.

In addition, the circuit elements respectively formed on the substrates are connected together between prescribed substrates through via holes (not shown).

According to the present invention, the chip inductor element forming the choke coil L1 in the switch circuit SW1 and the chip inductor element forming the choke coil L3 in the switch circuit SW2 are arranged on the lands 17 and 28 formed on the dielectric substrate 15 of the uppermost layer so that these chip inductor elements are located at least above the parts on which a circuit pattern on the fourteenth dielectric substrate 14 located just below the dielectric substrate 15 is not formed. In other words, the circuit patterns are not located on the parts of the fourteenth dielectric substrate, or preferably, on a plurality of substrates including the fourteenth dielectric substrate corresponding to areas in which the chip inductor elements on the dielectric substrate 15 of the uppermost layer are arranged. Thus, an adverse influence such as interference upon operation can be prevented.

Figure 5:
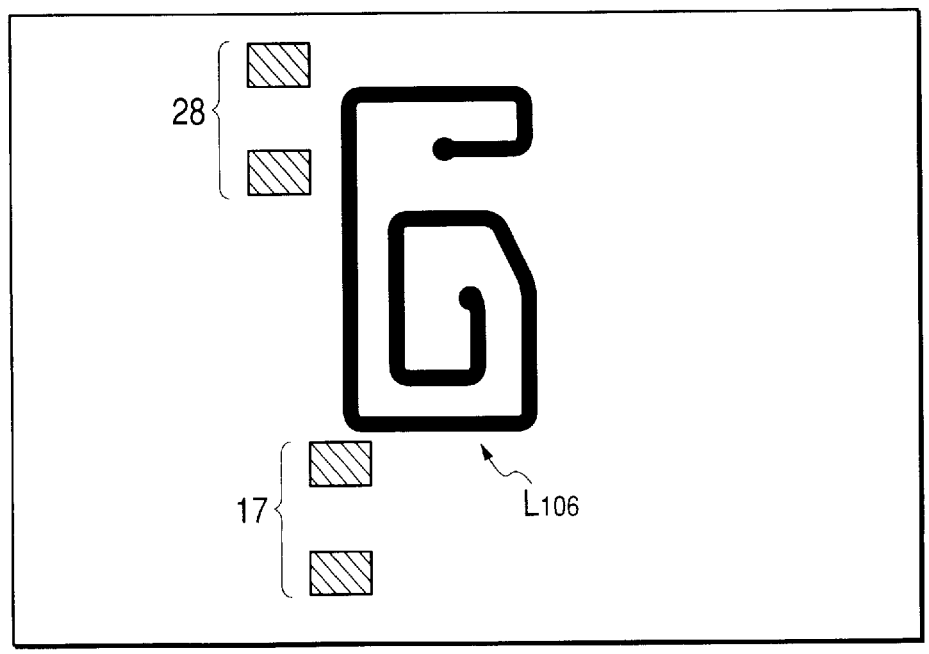
FIG. 5 is a schematic plan view showing the positional relation between a land area for mounting chip inductor elements on the high frequency circuit board as the uppermost layer in the dielectric laminated structure body shown in FIG. 3 and an inductor L106 formed on a dielectric substrate below the above-described layer.

That is, as shown in FIG. 5, the areas of the lands 17 and 28 formed on the dielectric substrate 15 as the uppermost layer in order to mount the chip inductor element forming the choke coil L1 in the switch circuit SW1 and the chip inductor element forming the choke coil L3 in the switch circuit SW2 are not superposed on the inductor L106 forming the diplexer DP formed on the fourteenth dielectric substrate 14. Thus, the adverse influence such as an inconvenience, for instance, the generation of noise, upon operation, due to the leakage of a signal supplied to the chip inductor elements L1 and L3 to the inductor L106 forming the diplexer DP or the interference of the chip inductor elements L1 and L3 with the inductor L106 forming the diplexer DP or the like can be prevented.

Now, the manufacture of the dielectric laminated structure body will be briefly described.

Initially, green sheets are prepared and desired parts, in other words, parts to be electrically connected above and below are perforated. All or a part of prescribed circuit elements are printed respectively on the perforated green sheets in accordance with a screen printing process by using Ag or AgPt. At the same time, the holes on the green sheets are respectively filled with Ag or AgPt by the screen printing method. After a prescribed time, the green sheets are respectively laminated and a baking or sintering process is performed.

Figure 6:
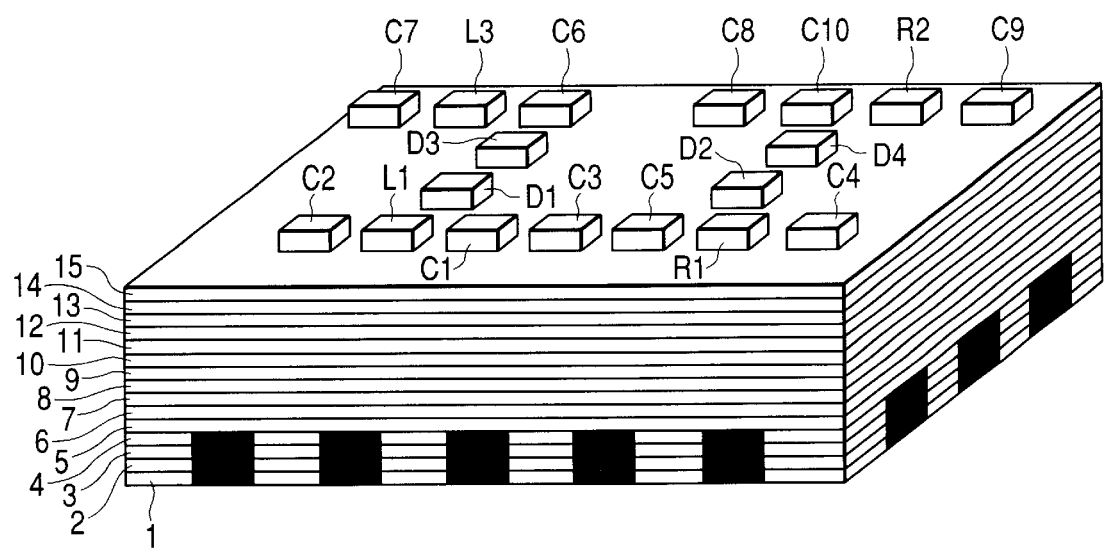
FIG. 6 is a schematic perspective view showing the antenna switch module for high frequency shown in FIG. 2.

After that, separately prepared chip elements forming the high frequency switching circuits SW1 and SW2 are mounted on the top part of the dielectric laminated structure body and cut into individual modules to be completed as shown in FIG. 6.

As described above, in the high frequency circuit board according to the present invention on which the choke coil circuit elements of the high frequency switching circuits are mounted as the chip inductors, since the lands for the chip inductors are formed on the surface of the high frequency circuit substrate and the lands for the chip inductors and inductor circuits or circuit patterns formed in another high frequency circuit substrate nearest to the surface of the above-described high frequency circuit substrate are positioned so that they are not superposed mutually in the direction of lamination of them, the bad influence such as the generation of noise or the interference can be prevented.

Further, in the antenna switch module for high frequency according to the present invention, since the lands for the chip inductors are formed on the uppermost layer of the dielectric layers forming the dielectric laminated structure body and the circuit patterns formed on the layer different from the uppermost layer and nearest to the uppermost layer and the lands for the chip inductors are positioned so that they are not superposed mutually in the direction of lamination of them, the size of the laminated structure body can be made compact and the influence of interference by the choke circuit elements can be substantially reduced. Therefore, there can be provided the high frequency switch module having such a dimension as to be completely adapted to the decrease of the accommodation capacity for the high frequency switch in the device due to the compact and light-weight communication device such as the portable telephone and capable of ensuring a stable operation.

Further, also in the high frequency switch module according to the present invention constructed for the dual band, since the lands for the chip inductors are formed on the uppermost layer of the dielectric layers forming the dielectric laminated structure body and the circuit patterns formed on the layer different from the uppermost layer and nearest to the uppermost layer and the lands for the chip inductors are positioned so that they are not mutually superposed in the direction of lamination of them, not only the decrease of the accommodation capacity defined in the communication device can be met, but also the influence of the interference by the choke circuit elements can be substantially reduced. Accordingly, a stable operation as the high frequency switch can be ensured.

This application is based on Japanese Patent application JP 2002-005027, filed Jan. 11, 2002, the entire content of which is hereby incorporated by reference, the same as if set forth at length.

What is claimed is:

1. A high frequency circuit board comprising:
   a choke coil circuit element of a high frequency switching circuit;
   a dielectric laminated structure body comprising a plurality of dielectric layers which comprise a first dielectric layer and a second dielectric layer;
   a land formed on the first dielectric layer; and
   a circuit pattern formed on the second dielectric layer,
   wherein the choke coil circuit element is mounted on the land as a chip inductor,
   the first dielectric layer is located at the end of the body,
   the second dielectric layer is located nearest to the first dielectric layer in at least one of the dielectric layers on which a circuit pattern is formed, and
   the land is positioned out of a region formed by projecting the circuit pattern formed on the second dielectric layer in the direction of laminating of the plurality of dielectric layers.

2. The high frequency circuit board according to claim 1, wherein the circuit pattern is an inductor circuit.

3. An antenna switch module for high frequency comprising:
   a filter circuit comprising an element;
   a high frequency switching circuit comprising a choke coil circuit element;
   a dielectric laminated structure body comprising a plurality of dielectric layers which comprise a first dielectric layer and a second dielectric layer;
   a land formed on the first dielectric layer; and
   a circuit pattern formed on the second dielectric layer,
   wherein the choke coil circuit element is mounted on the land as a chip inductor,
   the element is in the body,
   the first dielectric layer is located at the end of the body,
   the second dielectric layer is located nearest to the first dielectric layer in at least one of the dielectric layers on which a circuit pattern is formed, and
   the land is positioned out of a region formed by projecting the circuit pattern formed on the second dielectric layer in the direction of laminating of the plurality of dielectric layers.

4. The antenna switch module for high frequency according to claim 3,
   wherein the high frequency switching circuit comprises a diode forming a high frequency device, a resistance, a capacitor and an inductor,
   the diode, the resistance and a part of the capacitor are formed as a chip element and
   the inductor and the remaining parts of the capacitor are formed in the dielectric laminated structure body.

5. The antenna switch module for high frequency according to claim 3,
   wherein the filter circuit comprises a plurality of capacitor elements and a plurality of inductor elements, and
   the dielectric laminated structure body comprises:
   a plurality of dielectric layers on which the plurality of capacitor elements are formed;
   a plurality of dielectric layers on which the plurality of inductor elements are formed; and
   a plurality of dielectric layers on which other elements than the elements formed as chip elements in the high frequency switching circuit are formed.

6. The antenna switch module for high frequency according to claim 4,
   wherein the filter circuit comprises a plurality of capacitor elements and a plurality of inductor elements, and
   the plurality of dielectric layers comprises:
   a plurality of dielectric layers on which the plurality of capacitor elements are formed;
   a plurality of dielectric layers on which the plurality of inductor elements are formed; and
   a plurality of dielectric layers on which other elements than the elements formed as chip elements in the high frequency switching circuit are formed.

7. An antenna switch module for high frequency comprising:
   two filter circuits each comprising an element;
   two high frequency switching circuit each comprising a choke coil circuit element;
   a diplexer circuit comprising an element;
   a dielectric laminated structure body comprising a plurality of dielectric layers which comprise a first dielectric layer and a second dielectric layer;
   lands formed on the first dielectric layer; and a circuit pattern formed on the second dielectric layer, wherein each of the high frequency switching circuits is connected to an antenna through the diplexer circuit, the choke coil circuit element is mounted on the land as a chip inductor, all of the element are in the body, the first dielectric layer is located at the end of the body, the second dielectric layer is located nearest to the first dielectric layer in at least one of the dielectric layers on which a circuit pattern is formed, and the land is positioned out of a region formed by projecting the circuit pattern formed on the second dielectric layer in the direction of laminating of the plurality of dielectric layers.

* * * * *